United States Patent [19]
Campardo et al.

[11] Patent Number: 5,535,157
[45] Date of Patent: Jul. 9, 1996

[54] MONOLITHICALLY INTEGRATED STORAGE DEVICE

[75] Inventors: Giovanni Campardo, Bergamo; Raffaele Costa, Genova; Piero Torricelli, Brianza, all of Italy

[73] Assignee: SGS-Thomson Microelectronics S.r.l., Milan, Italy

[21] Appl. No.: 347,653

[22] Filed: Nov. 30, 1994

[51] Int. Cl.⁶ ............................ G11C 7/00; G11C 17/00
[52] U.S. Cl. ........................ 365/185.05; 365/103
[58] Field of Search ........................... 365/185, 94, 103, 365/104, 218, 189.01

[56] References Cited

U.S. PATENT DOCUMENTS

| | | | |
|---|---|---|---|
| 4,972,371 | 11/1990 | Komori et al. | 365/185 |
| 5,001,670 | 3/1991 | Slate et al. | 365/189.01 X |
| 5,132,928 | 7/1992 | Hayashikoshi et al. | 365/63 |

FOREIGN PATENT DOCUMENTS

| | | | |
|---|---|---|---|
| 0182198 | 5/1986 | European Pat. Off. | H01L 29/08 |
| 0347194 | 12/1989 | European Pat. Off. | G11C 17/00 |
| 0078195 | 4/1991 | Japan | 365/94 |

OTHER PUBLICATIONS

DeFrancesco et al., "Intelligent Non–Volatile Memory for Smart Cards," *IEEE Transactions on Consumer Electronics* 32(3):604–607, 1986.

*Primary Examiner*—A. Zarabian
*Assistant Examiner*—Son Dinh
*Attorney, Agent, or Firm*—David V. Carlson; Bryan A. Santarelli; Seed and Berry

[57] ABSTRACT

An integrated device with electrically programmable and erasable memory cells, including one time programmable (OTP) read-only memory cells. A matrix of user memory cells is added at least one row of OTP cells sharing the column selection lines with the other cells. Similarly to the other cells, these have a selection terminal connected to a row selection line. The source terminals of such OTP cells in the row are connected to the device ground through a common selection transistor which is driven from the same row selection line.

6 Claims, 1 Drawing Sheet

MONOLITHICALLY INTEGRATED STORAGE DEVICE

FIELD OF THE INVENTION

This invention relates to electrically programmable non-volatile storage cell devices comprising, in particular, non-erasable one time programmable (OTP) memory cells in addition to electrically erasable read/write memory cells.

BACKGROUND OF THE INVENTION

Non-volatile storage devices (EEPROMs, EPROMs and FLASH EEPROMs) may be written information in storage areas that are unaccessible by the user.

Such information is normally written in during the device testing procedure by the manufacturer and concerns the history of individual devices.

The information may include, for example, operation speed class, any redundancy used, manufacturing date and batch, and like items of information.

Non-volatile storage devices comprising memory cells are typically set up into a matrix type of architecture. In this type of architecture, rows and columns of cells are configured with lines to interconnect cells in one row and cells in one column. In some embodiments, it may be convenient to add, to rows driven by the row decoding facility which permits the user memory matrix to be accessed, a few rows of OTP cells in the matrix.

These rows utilize the same circuitry as the user memory matrix for read and write operations and are enabled by appropriate signals through the row decoding facility.

This kind of circuit architecture is conceptually simple and effective, but can create serious reliability problems with electrically erasable non-volatile storage cell devices, in particular with FLASH EEPROMs.

The possibility to electrically erase information written in memory cells allows thousands of write/erase cycles to be carried out. As the result of these extensive write/erase cycles the circuit elements in such devices, and the memory cells especially, are highly stressed and may develop malfunctions.

In facts where the erasing is performed electrically by acting on the source of the memory cell field-effect transistor with the gate clamped to a ground potential of the device, while the drain potential is allowed to float and the source potential is brought up to a value relative to ground which can generate the required electric field to produce a tunneling effect in the source areas, the selection of the potential reference to which the sources of the OTP cells should be connected becomes a critical one.

It is impossible to leave the source side of the OTP cells connected to that of the user memory cells, constituting the matrix virtual ground, because the erase operation would result in the OTP cells being also erased.

Nor is it practical to connect the source side of the OTP cells to the real ground of the device. Such connection is not practical because, during write operations, the drains are raised to a high potential. The OTP cells, having their drains at a high potential and their sources connected to ground, can inadvertently become erased due to the creation of a subthreshold current. This subthreshold current also produces a depletion that impairs the reliability of the user memory cells in the same column.

These problems have led the designers to avoid the inclusion of rows of OTP cells to the cell matrix with user memory cells of the FLASH EEPROM type.

SUMMARY OF THE INVENTION

A preferred aspect of this invention is to allow rows of OTP cells to be included in the memory cell matrix of an electrically erasable storage with no reliability or operation problems.

This problem is solved by a circuit of electrically erasable memory cells in a matrix type architecture and defined in the characterizing parts of the appended claims to this specification.

The features and advantages of an electrically erasable storage cell device using memory cells of the OTP type, according to the invention, will be apparent from the following description of an embodiment thereof, given by way of example and not of limitation with reference to the accompanying drawing.

DETAILED DESCRIPTION OF THE INVENTION

Figure 1:
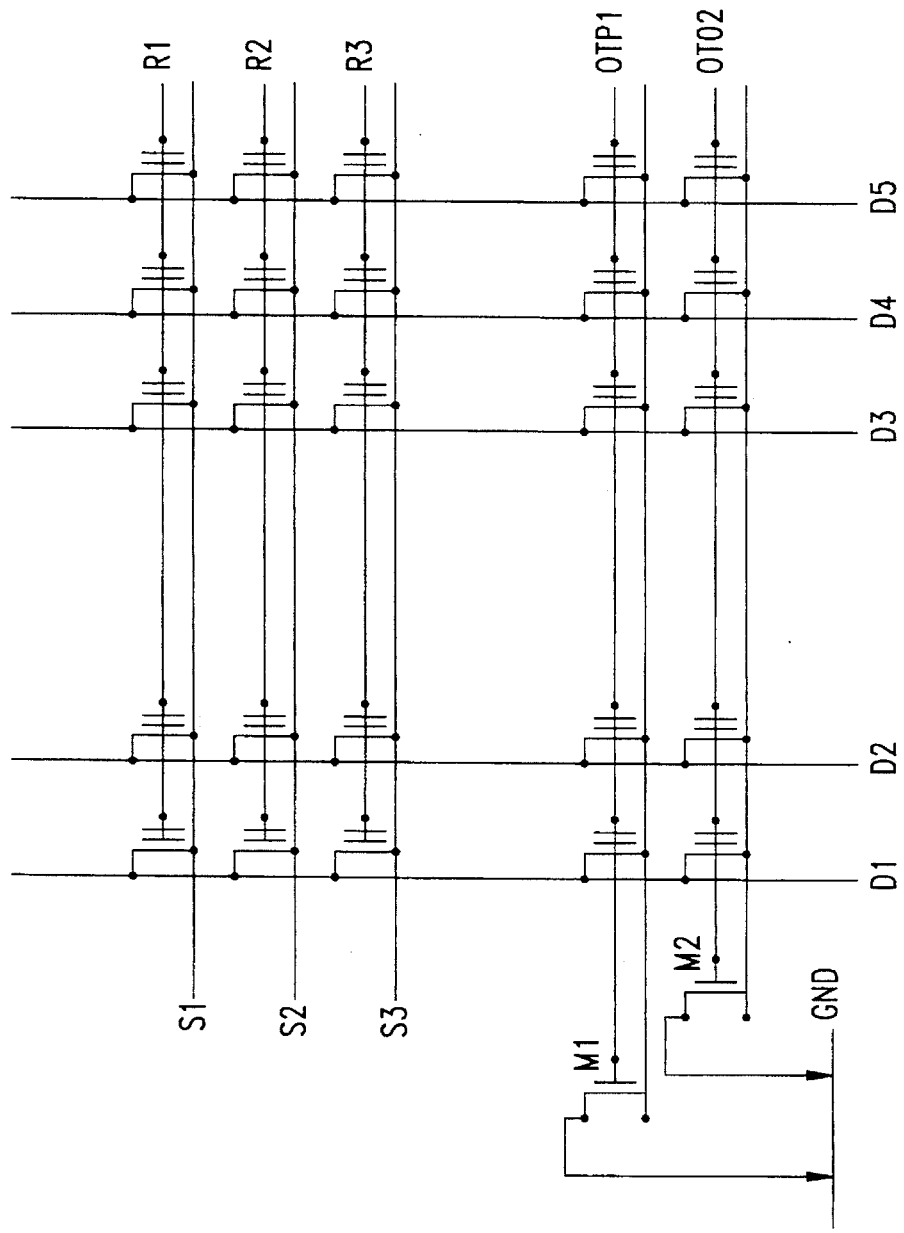
FIG. 1 shows the memory cell matrix of a storage device, which is electrically erasable and also includes OTP type memory cells.

FIG. 1 illustrates a matrix type circuit arrangement for memory cells of an electrically erasable non-volatile storage device. The device comprises rows of programmable and erasable user memory cells, as well as rows of OTP memories. The OTP memories are programmable and non-erasable memories and are denoted as OTP1 and OTP2.

The drain terminals of all the transistor structures of the memory cells, including the OTPs, in one column are connected to a common column selection line, D1, D2, ... , or bit line where the columns relate to bits of a word written in the memory.

On the other hand, the gate terminals of all the memory cells, including the OTPs, in one row are connected to a common row decoding line R1, R2, ... , OTP1 and OTP2.

The source terminals of all the re-programmable and electrically erasable user memory cells are connected to a control line. The sources of such cells are either applied with an erase-state potential or a read/program-state potential.

More than one control line can be provided in embodiments where the cells are controlled by row sectors (S1, S2, ... ). In accordance with the illustrated embodiment of the invention, all the source terminals of the non-erasable OTP memory cells in one row are connected to a common line. In turn, this common line is connected to a potential reference GND, preferably the device ground, through an electronic switch comprising a switching transistor (M1, M2).

One switching transistor is required for each row of OTP cells. According to the invention, the control terminals; of such transistors, which are field-effect transistors as shown, are connected to the same row decoding lines for the respective rows, OTP1 and OTP2.

By enabling a row of OTP cells, through its respective decoding line, the sources of those cells are brought to ground potential through the transistor operated by the decoding line. Thus, reading such cells or initially programming them is allowed.

During the user memory cell erasing step, erasing the OTP cells is avoided by keeping the selection transistor in the off state. In this way, the OTP cells cannot see ground, in fact. This is accomplished by clamping the OTP row decoding lines to a ground potential.

In addition, in the event of OTP cells being spuriously erased during the write step when the drain potentials are raised—which occurrence may originate, in principle, from the appearance of hot holes in the drain areas—the user memory cell reading would remain unaffected because the OTP cells are not connected directly to ground, but rather through an intervening transistor, and cannot form a current flowpath.

An outstanding advantage is that the need for additional external control signals to drive the selection transistors of the OTP cells is avoided, since the transistors are controlled from the OTP row decoding lines.

It should be understood that modifications, integrations and substitutions of elements may be made unto the embodiment described above by way of illustration and not of limitation, without departing from the protection scope of the following claims.

We claim:

1. A monolithically integrated storage device comprising electrically programmable non-volatile memory cells interconnected into a matrix configuration of cell rows and columns, with each cell having at least a first terminal connected to a control line for controlling the cell state from the row to which that cell is included, a second terminal connected to a section line for the column including the cell, and a selection terminal connected to a decoding line for the row including the cell, said cell matrix configuration having at least one row of electrically erasable read/write cells and at least one row of non-erasable read-only cells, characterized in that an electronic switch is connected between a reference potential and the control line controlling the state of the non-erasable read-only cells, said switch having a control terminal connected to the decoding line for the row of non-erasable read-only cells.

2. A storage cell device according to claim 1, characterized in that the electronic switch is a field-effect transistor having a gate terminal connected to the read-only cell row decoding line.

3. A storage cell device according to claim 2, characterized in that the potential reference is the ground potential of the device.

4. A storage cell device according to claim 1, characterized in that the potential reference is the ground potential of the device.

5. A method for selectively programming one time programmable memory cells wherein the one time programmable memory cells are embodied in a storage device that is formed by a plurality of memory cells, the plurality of memory cells being arranged in respective rows and columns, wherein the one time programmable memory cells form at least one row of one time programmable memory cells, wherein the row of one time programmable memory cells further comprises a selection switch, the selection switch having a first path terminal connected to a reference potential, a second path terminal that is connected to a second path line, and a control terminal connected to a row decoding line for the row of one time programmable memory cells, wherein each one time programmable memory cell of the row of one time programmable memory cells has a first path terminal connected to a respective column selection line, a second path terminal connected the second path line, and a control terminal connected to the row decoding line for the row of one time programmable memory cells, the method comprising the steps of:

enabling the row of one time programmable memory cells by placing a conductive potential on the row decoding line, the conductive potential placing the one time programmable memory cells and the selection switch in states of conduction so as to couple the second path terminals of the one time programmable memory cells and the second path terminal of the selection switch to the reference potential; and programming a desired one time memory cell by placing, while the row of one time programmable memory cells is enabled, a programming potential on the respective column selection line of the desired one time memory cell.

6. The method of claim 5, further comprising the step of:

after programming the desired one time memory cell, inhibiting the erasing of the desired one time programmable memory cell by placing a non-conductive potential on the row decoding line so as to prevent a coupling of the reference potential with the second path terminal of the desired one time programmable memory cell.

* * * * *

UNITED STATES PATENT AND TRADEMARK OFFICE
CERTIFICATE OF CORRECTION

PATENT NO. : 5,535,157
DATED : July 9, 1996
INVENTOR(S) : Giovanni Campardo et al.

It is certified that error appears in the above-indentified patent and that said Letters Patent is hereby corrected as shown below:

In column 3, line 32, please delete "section" and insert therefor --selection--.

Signed and Sealed this

Twenty-fourth Day of December, 1996

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO.   : 5,535,157
DATED        : July 9, 1996
INVENTOR     : Giovanni Campardo, Raffaele Costa and Piero Torricelli It is certified that error appears in the above identified patent and that said Letters Patent is hereby corrected as shown below:

Title page, below item [22], add the following:

[30] Foreign Application Priority Data

Nov. 30, 1993  [EP]  European . . . . . . . . . . . . . 93830481.3

Signed and Sealed this

First Day of July, 1997

*Attest:*

BRUCE LEHMAN

*Attesting Officer*   *Commissioner of Patents and Trademarks*